June 2, 1970 W. A. GETTIG 3,516,046

EDGE CONNECTOR FOR PRINTED CIRCUIT BOARD

Filed Feb. 27, 1968

INVENTOR.

WILLIAM A. GETTIG

BY

Emory L. Groff Jr.

ATTORNEY

United States Patent Office 3,516,046 Patented June 2, 1970

1 2

3,516,046
EDGE CONNECTOR FOR PRINTED CIRCUIT BOARD

William A. Gettig, Centre City, Pa.
(Box 85, Spring Mills, Pa. 16875)

Filed Feb. 27, 1968, Ser. No. 708,577
Int. Cl. H01r 23/02; H05k 1/04
U.S. Cl. 339—176 15 Claims

ABSTRACT OF THE DISCLOSURE

A connector member for joining an electrical lead wire to a printed circuit board. An integral housing is provided with a throat and a continuous recess for supporting a stripped solid, fused or stranded conductor with a pure tin overlay in an exposed position within the throat whereby this conductor provides a direct contact adapted to engage circuitry on a printed circuit board.

This invention relates generally to connecting devices as used in association with printed circuit boards and more particularly to an edge connector of unitary construction adapted to be assembled in a gang-like manner to provide a modular connector assembly.

Edge connectors, as now envisioned for use with printed circuit boards, usually comprise a housing having a through passageway adapted to receive the edge of a printed circuit board. The most common manner of transmitting electrical continuity from the lead wire to the copper pads or conductors on the printed circuit board is by means of one or more metallic terminals which must be provided within the connector housing. During the assembly of the lead wire and connector housing it is necessary to provide some means for securing the stripped end of the lead wire to these terminals. It is the fabrication, placement and electrical joining of these terminals to the lead wire conductor that has priced such prior known connectors beyond the consideration of many potential users; in addition to these economic disadvantages one must consider the electrical joint resistance evident as a result of the attachment of the lead wire conductor to the terminal member as commonly used in the majority of such edge connectors.

Space consideration is an important feature to be reckoned with in the environment wherein edge connectors of the present type are used. Attempts in the past to provide an edge connector which may be assembled in gang-like manner to provide a modular assembly without exceeding space limitations have fallen far short. In many prior known devices multiple or gang connectors are provided at the time of initial manufacture merely by assembling a plurality of terminal contacts in an adjacent manner within an insulating housing of adequate size to encompass the desired number of connectors. By this arrangement, it will be seen that little thought is given to the ultimate desires of the user, which may require the addition or deletion of means for connecting certain of the lead wires to any one single printed circuit board.

Thus, it will be seen that a need has existed for an integral edge connector housing member which may be utilized either singly or in combination with any number of similar housings whereby the user may assemble at the site of installation an edge connector module occupying a minimum of space yet providing a separate insulated connector body for each one of the lead wires desired to be connected to the printed circuit board at hand.

Accordingly, one of the primary objects of the present invention is to provide an improved edge connector for printed circuit boards comprising a unitary body of insulating material.

Another object of the present invention is to provide an edge connector for printed circuit boards comprising a closed and an open side face, which open face is provided with lead wire conductor receiving means.

A further object of the present invention is to provide an edge connector for printed circuit boards comprising a housing having integral means permitting assembly of any number of said housings to provide a modular connector assembly.

Another object of the present invention is to provide an edge connector for printed circuit boards having means for securely retaining the stripped end of a lead wire for direct electrical contact with a conductor pad on a printed circuit board without the inclusion of separate metallic terminals.

Still another object of the present invention is to provide an edge connector for printed circuit boards including a housing having upper and lower channels therein which provide for a selective placement of a lead wire conductor in a manner to provide either a single or double exposed contacts for use with either a single or double-faced printed circuit board.

A further object of the present invention is to provide an improved edge connector and printed circuit board assembly including cooperating means on the connector assembly and circuit board to insure proper alignment therebetween.

With these and other objects in view which will more readily appear as the nature of the invention is better understood the invention consists in the novel construction, combination and arrangement of parts hereinafter more fully described, illustrated and claimed.

The preferred and practical embodiment of the invention is shown in the accompanying drawing, in which.

Similar reference characters designate corresponding parts throughout the several views of the drawing.

Figures 1, 2, 3, 4, 5:
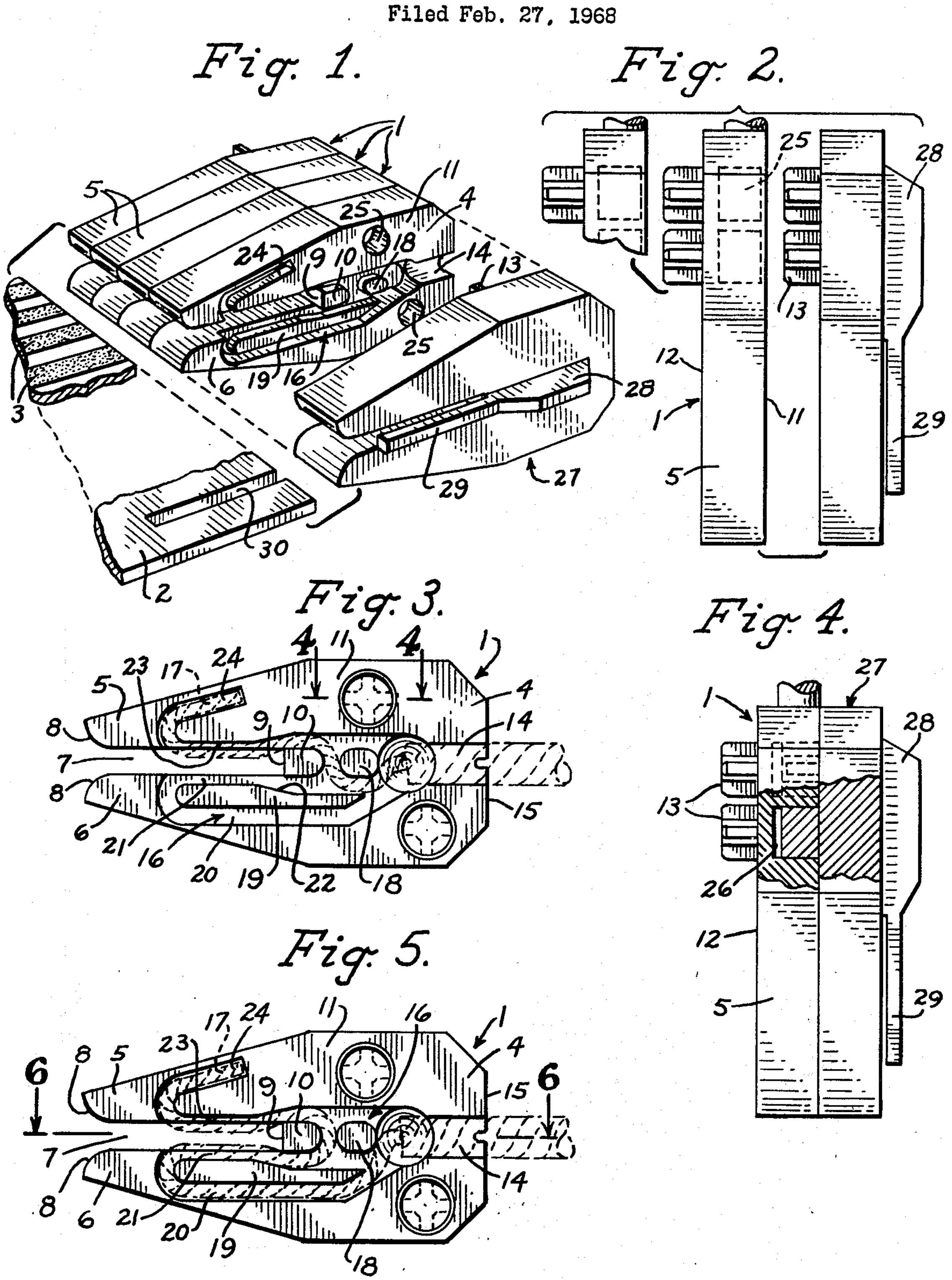
FIG. 1 is a perspective exploded view of a modular arrangement of the edge connector of the present invention.
FIG. 2 is a fragmentary top plan view of a plurality of edge connectors according to the present invention.
FIG. 3 is a side elevation of one of the edge connectors.
FIG. 4 is a top plan view, partly in section, of a pair of joined housings and discloses the manner of connection therebetween.
FIG. 5 is a side elevation similar to FIG. 3 but illustrates the disposition of the stripped portion of the lead wire conductor within both the top and bottom channels of the housing to provide dual contacts for use with a double-faced printed circuit board.
Figure 6:
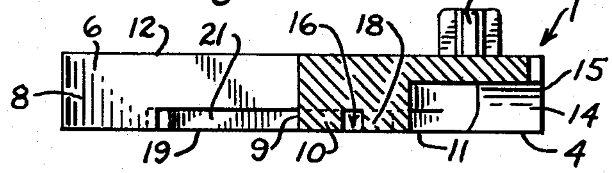
FIG. 6 is a horizontal sectional view taken along the line 6—6 of FIG. 5.

Referring now to the drawing, more particularly FIG. 1, the present invention will be seen to include an edge connector comprising a housing, generally designated 1, adapted to cooperate with the exposed adjacent edge of a printed circuit board 2 having any desired number of copper pads or printed circuitry conductors 3 deposited upon the surface thereof. Each housing 1 comprises an integral body of any suitable insulating composition such as nylon plastic, and includes a rear section 4 from which extend an upper finger 5 and lower finger 6 spaced apart one another to provide the throat 7 which is bounded by parallel top and bottom surfaces of the two fingers. preferably, the extremities of the two fingers 5 and 6 are rounded to provide the inwardly curved nose portions 8 as most clearly shown in FIGS. 3 and 5. The rearwardmost limit of the throat 7 is defined by means of the vertically disposed stop wall 9 forming one surface of the separator block 10.

Neither the top and bottom sections or the front and rear faces of the housing are identical in construction. It will be seen that the open side wall or face 11 as shown in FIGS. 3 and 5 is provided with a plurality of distinguishing characteristics, while the opposite side wall or face 12 will be understood to be flush or planar except for a pair of outwardly extending members 13 which will be described hereinafter.

A substantially semi-circular recess or groove 14 is formed in the open face 11 in the body of the rear section 4 and will be seen to be medially disposed therethrough along the horizontal axis of the housing 1 and extends through the material of the rear wall 15 of the housing. The forward portion of this lead wire groove 14 communicates with a conductor recess generally designated 16. The transverse depth of the recess 16 throughout its extent in the housing 1 is approximate to the diametrical dimension of the stripped lead wire conductor 17; however the width or vertical extent of this recess will be seen from a review of FIGS. 3 and 5 to vary considerably. In the area of the recess 16 but spaced from the forward portion of the lead wire groove 14, a divider post 18 will be seen to be surrounded on all sides by the recess and includes sufficient space between its opposite ends and the juxtaposed lead wire groove 14 and separator block 10 to permit passage of one turn of a lead wire conductor 17. The area of the recess 16 within the lower finger 6 includes an axially extending partition 19 serving to divide the recess in this finger into a bottom channel 20 and a lower horizontal contact recess 21. The upper surface of the partition 19 will be seen to comprise a multi-planar surface formed by the interconnecting inclined surface 22, the purpose of which structure will be described hereinafter. In the area of the upper finger 5 the conductor recess 16 comprises an upper horizontal contact recess 23 likewise presenting a multi-planar surface due to the inclined surface 22 which is symmetrical to the opposed inclined surface 22 formed on the partition 19 in the lower finger 6. In the forward portion of the upper finger 5 the upper horizontal contact recess 23 extends upwardly and then rearwardly within the upper finger 5 to provide a top channel 24 which may terminate in the dead end manner as illustrated.

Reference will now be made to the manner of attaching a lead wire L to one of the above described connector housings 1. Unlike the majority of the previously known types of edge connectors there is no need for the use of any metallic spring contact or terminal strips in association with the present edge connector. From the drawings it will be seen that a lead wire L is connected directly to the housing 1 and its stripped conductor 17 so positioned within the housing that this very conductor 17 serves as a direct contact member designed to engage the printed circuitry conductors 3.

When it is desired to connect a lead wire L to a housing 1 in order to provide contact with a printed circuit board having conductors 3 on only one face thereof, or alternatively, if it is only desired to provide an electrical contact with the conductors 3 on only one side of a double-faced printed circuit board, then the arrangement shown in FIG. 3 will be followed. In this arrangement, it will be seen that the lead wire L and its insulating covering are disposed through housing access means comprising the lead wire groove 14 in the rear section 4 of the housing and all of the insulated covering forward of this groove 14 is stripped. For reasons which will become obvious hereinafter, the transverse extent of the groove 14 is no less than the diameter of the lead wire L such that its insulation will not project laterally beyond the plane of the open face 11 of the housing. Following this, the lead wire conductor 17 is positioned within the conductor recess 16 as shown in FIG. 3 such that the circuitous path as provided by the divider post 18, the separator block 10, the upper horizontal contact recess 23 and top channel 24 will be followed by the conductor 17. As previously described, the transverse extent or depth of the conductor recess 16 is no less than the diameter of the lead wire conductor 17 whereupon it will be apparent that when the conductor 17 is properly positioned within the housing 1 no portion of the conductor 17 will project transversely from beyond the adjoining face of the housing open face 11.

By the very nature of the various projections and camming surfaces associated with the conductor recess 16, it will be understood that the conductor 17 will be securely positioned within the housing. An important feature of the horizontal contact recesses 21 and 23 is that the vertical height or depth thereof is less than the diameter of the stripped lead wire conductor 17 such that a positioned conductor will substantially project into the throat 7 formed by the upper finger 5 and lower finger 6 as shown in the drawing. From the foregoing one will readily appreciate that when the housing 1 is mounted about a printed circuit board 2, the conductor pads 3 upon the board will engage the projecting portion of the conductor 17 extending inwardly toward the middle of the throat 7 to complete the electrical circuit, with the free edge of the printed circuit board 2 abutting the stop wall 9 of the housing.

Should it be desired to provide electrical communication between a single lead wire L and both the top and bottom pads or conductors 3 on a double-faced printed circuit board, then the stripped lead wire conductor 17 would be mounted within the edge connector housing 1 as shown in FIG. 5 of the drawing, wherein it will be seen that the lead wire L is similarly mounted within the groove 14; however the conductor 17 moves from its emergence from the groove 14 downwardly through the bottom channel 20 in the lower finger 6 up over the top of the partition 19 and along the lower horizontal contact recess 21, thence around the separator block 10 and the upper horizontal contact recess 23 and into the top channel 24. In this manner it will be seen that two exposed portions of the same single lead wire conductor 17 are provided within the throat 7 of the housing, one of these portions projecting upwardly from the lower finger 6 while the other extends downwardly from the upper finger 5 such that when a printed circuit board 2 having conductor pads 3 on both surfaces thereof is positioned within the throat 7 simultaneous electrical communication is made with both the upper and lower pads 3. At this point one may more readily appreciate the placement of the paths of the recess 16 and the spaced apart divider post 18 and separator block 10. As will be seen these features provide not only a torturous path to rigidly mount the conductor 17 in place but also provide adequate barriers to insure electrical separation between any two portions of the conductor 17.

As previously mentioned, the transverse dimension of the recess 16 is no less than the diameter of the lead wire conductor 17 intended to be used therein in order to insure that no portion of the conductor projects outwardly from the plane of the open face 11 of the housing. Quite obviously, the vertical width of the bottom channel 20 and top channel 24 can be no less than the diameter of the conductor 17; however it is preferred that this width be only so much greater than the diameter of the lead wire as is necessary to permit ready insertion and removal of the conductor 17 during assembly and disassembly thereof. By keeping the width of the channel to a minimum it will follow that a much tighter engagement will be achieved between the conductor and the walls of the channels, thereby further insuring the retention of the conductor 17 in its assembled position.

The foregoing description relates to the construction of any one single connector housing 1 which may, quite obviously, be used to connect any one lead wire L to any preselected conductor 3 on a printed circuit board 2. The present arrangement, however, offers a further feature whereby any number of connector housings 1 of identical construction may be readily connected together without any additional structure or tools to provide a module comprising a plurality of lead wires L and their respective conductors 17 in order to permit the rapid and simultaneous electrical connection to a corresponding number of pads or conductors 3 on a printed circuit board. The significance of such a feature when practiced by means of the present invention will be readily appreciated when one considers that prior know devices exhibiting such a general characteristic usually require a detailed assembly operation using special tools, added components, and requiring metallic terminal members for each of the lead wires, all of which was usually mounted in an overall assembly which was permanent in nature. With the present connector housing 1 it will be understood that any number of such housings may be massed in adjacent relationship such as shown in FIG. 1 to provide a module capable of handling any number of corresponding lead wires L. The ready assembly of such a module is possible by means of a pair of outwardly projecting pins 13 extending from the flush face 12 of each of the housings 1, which pins cooperate and engage within a pair of oppositely disposed pin holes 25 provided in the open face 11 of each of the housings 1. To insure face to face contact between each pair of adjacent housings, the axial depth of each pin hole 25 is preferably slightly greater than the axial extent of each pin 13 in order to provide a minimal pin clearance 26 as shown in the assembled view of FIG. 4. Quite obviously, any other suitable means may be employed for securing lateral attachment of a plurality of housings.

When the desired number of connector housings 1 have been assembled to form the subject module, then a separate end cap 27 is positioned adjacent the open face 11 of the endmost housing 1 such as shown in FIGS. 1, 2 and 4. The end cap 27 includes substantially the same basic outer configuration as the housing 1 and includes on one side thereof a pair of the pins 13 or other fastening means; however both of the side walls or faces will be understood to be otherwise flush. An added feature of this end cap 27 is the inclusion of a key 28 which projects outwardly from one side wall of the cap and extends axially toward the free ends of the upper and lower fingers in a plane coinciding with the throat therebetween, this latter extension comprising a locking and alignment leg 29. As shown in FIG. 1 of the drawing, the leg 29 is adapted to cooperate with a mating key slot 30 provided in the printed circuit board 2 such that when a completed module including an end cap 27 is attached to the board 2, the key 28 rigidly affixes the module to the circuit board in proper alignment therewith to preclude transverse displacement of the module which would obviously interrupt the electrical connections, and if sufficiently displaced, could cause cross-electrical connections often leading to disastrous results.

Another advantage of the present invention will be apparent with the realization that the lead wire conductor 17 usually comprises a mass of tin bonded strands. It will therefore follow that during application of the edge connector to a printed circuit board these tin bonded strands will serve to abraid the oxidized copper pads on the board therefore enhancing the electrical communication therebetween by providing contact with clean metal.

I claim:

1. An electrical connector for receiving the stripped end portion of a lead wire current conductor integral with the lead wire and adapted to engage a printed circuit board, comprising a housing having a rear section and a pair of spaced apart forwardly extending fingers defining a throat therebetween for the reception of a printed circuit board, access means through said rear section to receive said lead wire, said housing including a stripped conductor recess communicating at the rear with said access means and extending forwardly and longitudinally into at least one of said fingers, a portion of said recess opening directly into said throat, that portion of said recess facing said throat comprising a rigid surface on said finger, and said lead wire passes through said access means and has its stripped conductor disposed within said recess and is immovably supported by said rigid surface with a portion of said conductor exposed within said throat.

2. An electrical connector as claimed in claim 1, wherein said housing includes a divider post supported by said constructed recess and spaced from said access means and said throat, and said stripped conductor immovably engages said divider post.

3. An electrical connector as claimed in claim 1, wherein, said housing is of unitary contruction and is formed of an electrically insulative composition.

4. An electrical connector as claimed in claim 1, wherein, said conductor recess is formed in one side face of said housing and the opposite side face is substantially flush.

5. An electrical connector as claimed in claim 1, wherein, said conductor recess extends forwardly into both of said fingers.

6. An electrical connector as claimed in claim 5 including a partition within one of said fingers surrounded by said conductor recess and immovably engaging said stripped conductor on at least two sides thereof.

7. An electrical connector as claimed in claim 6, wherein, both of said fingers include a horizontal contact recess comprising said conductor recess portion and the vertical depth thereof from said throat is less than the diameter of said stripped conductor.

8. An electrical connector as claimed in claim 5, wherein said housing includes a separator block adjacent said conductor recess defining the rearmost portion of said throat, a divider post disposed within said conductor recess and spaced from said access means and said separator block, and said stripped conductor immovably engages said divider post and said separator block.

9. An electrical connector an claimed in claim 1, wherein, said housing includes a separator block adjacent said conductor recess and defining the rearmost portion of said throat.

10. An electrical connector as claimed in claim 1, wherein, said conductor recess portion opening directly into said throat comprises a horizontal contact recess having a vertical depth from said throat less than the diameter of said stripped conductor.

11. An electrical connector as claimed in claim 1, wherein, said housing includes releasable fastening means on either side thereof to permit ganging of a plurality of said housings in lateral adjacent relationship.

12. An electrical connector as claimed in claim 11, wherein, said fastening means comprises a male projection on one side of said housing and a female opening on the other side thereof axially aligned with said projection.

13. An electrical connector assembly for receiving the stripped end portions of a plurality of lead wire current conductors each integral with a lead wire and adapted to engage a printed circuit board, comprising a plurality of connector housings each including, a rear section and a pair of spaced apart forwardly extending fingers defining a throat therebetween for the reception of a printed circuit board, access means through said rear section to receive said lead wire, each said housing including a stripped conductor recess communicating at the rear with said access means and extending forwardly and longitudinally into at least one of said fingers, a portion of said recess opening directly into said throat, that portion of said recess facing said throat comprising a rigid surface on said finger, and one of said lead wires passes through each said access means and has its stripped conductor disposed within said recess and is immovably supported by said rigid surface with a portion of said conductor exposed within said throat, and releasable fastening means retaining said plurality of housings in lateral adjacent relationship.

14. An edge connector assembly according to claim 13, including an end cap releasably attached to the endmost of said housings.

15. An edge connector assembly according to claim 14, wherein, said end cap includes alignment means engageable with mating means on said printed circuit board.

References Cited

UNITED STATES PATENTS

| | | | |
|---|---|---|---|
| 1,751,405 | 3/1930 | Herman. | |
| 2,544,343 | 3/1951 | Miller | 339—105 |
| 2,911,609 | 11/1959 | Burtt et al. | |
| 2,922,139 | 1/1960 | Ustin. | |
| 2,937,357 | 5/1960 | Kennedy. | |
| 2,957,155 | 10/1960 | Ehrlich. | |
| 3,329,926 | 7/1967 | Aksu et al. | |
| 3,360,767 | 12/1967 | Brown et al. | 339—76 |

FOREIGN PATENTS

| | | |
|---|---|---|
| 1,089,838 | 9/1960 | Germany. |

DAVID J. WILLIAMOWSKY, Primary Examiner

P. C. KANNAN, Assistant Examiner

U.S. Cl. X.R.

339—17, 186, 198